US 6,751,124 B2

(12) United States Patent
Lee

(10) Patent No.: US 6,751,124 B2
(45) Date of Patent: Jun. 15, 2004

(54) BIT LINE SETUP AND DISCHARGE CIRCUIT FOR PROGRAMMING NON-VOLATILE MEMORY

(75) Inventor: Yeong-Taek Lee, Seoul (KR)

(73) Assignee: Samsung Electronics Co., Ltd., Kyunggi-Do (KR)

( * ) Notice: Subject to any disclaimer, the term of this patent is extended or adjusted under 35 U.S.C. 154(b) by 0 days.

(21) Appl. No.: 10/255,214

(22) Filed: Sep. 26, 2002

(65) Prior Publication Data
US 2003/0026144 A1 Feb. 6, 2003

Related U.S. Application Data

(62) Division of application No. 09/791,473, filed on Feb. 22, 2001, now Pat. No. 6,480,419.

(51) Int. Cl.⁷ .................................................. G11C 7/00
(52) U.S. Cl. ..................... 365/185.18; 365/185.11; 365/185.25; 365/203; 365/204
(58) Field of Search ........................ 365/185.18, 226, 365/185.25, 185.11, 203, 204

(56) References Cited

U.S. PATENT DOCUMENTS

| | | | |
|---|---|---|---|
| 5,798,967 A | | 8/1998 | Sarin et al. |
| 5,818,761 A | * | 10/1998 | Onakado et al. ......... 365/185.18 |
| 5,889,720 A | | 3/1999 | Lisart et al. |
| 6,058,042 A | | 5/2000 | Nobukata ............... 365/185.03 |
| 6,058,044 A | | 5/2000 | Sugiura et al. ......... 365/185.17 |
| 6,097,638 A | | 8/2000 | Himeno et al. ......... 365/185.25 |
| 6,172,917 B1 | | 1/2001 | Kataoka et al. ......... 365/189.05 |
| 6,278,636 B1 | | 8/2001 | Lee ........................ 365/189.05 |
| 6,469,955 B1 | * | 10/2002 | Tsao et al. ............... 365/238.5 |
| 6,480,419 B2 | * | 11/2002 | Lee ........................ 365/185.18 |
| 6,556,508 B2 | * | 4/2003 | Tsao et al. ............... 365/238.5 |
| 2002/0051385 A1 | * | 5/2002 | Hosono et al. ......... 365/185.22 |
| 2002/0114188 A1 | * | 8/2002 | Lee ........................ 365/185.18 |
| 2003/0021154 A1 | * | 1/2003 | Lee ........................ 365/185.18 |
| 2003/0026145 A1 | * | 2/2003 | Lee ........................... 365/200 |
| 2003/0039142 A1 | * | 2/2003 | Tsao et al. ............. 365/185.12 |

* cited by examiner

Primary Examiner—Viet Q. Nguyen
(74) Attorney, Agent, or Firm—Harness, Dickey

(57) ABSTRACT

A NAND EEPROM having a shielded bit line architecture reduces supply voltage and ground noise resulting from charging or discharging bit lines. The EEPROM has a PMOS pull-up transistor and an NMOS pull down transistor connected to a virtual power node. A control circuit for charging or discharging bit lines controls the gate voltage of the PMOS or NMOS transistor to limit peak current when charging or discharging bit lines via the virtual power node. In particular, the control circuit operates the PMOS or NMOS transistor in a non-saturation mode to limit current. One such control circuit creates a current mirror or applies a reference voltage to control gate voltages. A programming method sets up bit lines by pre-charging unselected bit lines via the PMOS pull-up transistor having controlled gate voltage while latches in the programming circuitry charge or discharge selected bit lines according to respective data bits being stored. Another bit line setup includes two stages. A first stage pre-charges all bit lines via PMOS pull-up, and the second stage uses the latches to discharge or leave charged the selected bit lines depending on respective data bits being stored. The gate voltages of NMOS transistors in the programming circuitry can be controlled to reduce noise caused by discharging selected bit lines through the latches.

2 Claims, 8 Drawing Sheets

BIT LINE SETUP AND DISCHARGE CIRCUIT FOR PROGRAMMING NON-VOLATILE MEMORY

CROSS-REFERENCE TO RELATED APPLICATION

This application is a divisional of U.S. patent application Ser. No. 09/791,473, filed Feb. 22, 2001 now U.S. Pat. No. 6,480,419.

BACKGROUND

1. Field of the Invention

This invention relates to nonvolatile semiconductor memory devices and write or programming processes for nonvolatile semiconductor memory devices.

2. Description of Related Art

EEPROMs, unlike many other nonvolatile memories, can electrically erase old data and write new data. This flexibility in data management makes EEPROMs the preferred non-volatile memory in system programming, where data may be refreshed and must be available when a system powers up.

A conventional memory cell in an EEPROM includes an N-channel cell transistor, which has a floating gate over a channel region defined between N+ source and drain in a P-type substrate, and a control gate overlying the floating gate. The floating and control gates are made out of a conductive material such as polysilicon, a silicide, or a metal, and insulation layers are between the control and floating gates, and between the floating gate and the channel region.

In flash EEPROM, a common mechanism for erasing and programming memory cells is Fowler-Nordhiem (F-N) tunneling. F-N tunneling changes the threshold voltage of a cell transistor by changing the amount of charge trapped on the floating gate of the cell transistor. For example, an exemplary erase operation applies a high voltage to a substrate while applying a low or negative voltage to the control gate of an N-channel cell transistor. The floating gate, which is between the control gate and the substrate, has a voltage that depends on the net charge trapped on the floating gate, the capacitance between the control gate and the floating gate, and the capacitance between the floating gate and the substrate. If the voltage difference between the floating gate and the substrate is larger than a voltage gap required for the F-N tunneling, electrons held in the floating gate tunnel from the floating gate into the substrate. The tunneling of the electrons from the floating gate to the substrate lowers the threshold voltage Vt of the cell transistor.

When the threshold voltage Vt is sufficiently low, the cell transistor conducts a channel current when 0V is applied to the control gate and source of the cell transistor and a positive voltage is applied to drain of the cell transistor. A cell transistor having this lowered threshold voltage is referred to as an "erased cell" or as being in an "erased state," which represents data value "1".

In an exemplary programming operation that writes a data value "0" into a cell transistor, a low voltage (e.g., 0V) is applied to the source and drain of the cell transistor, and a high voltage (often more that 10V) is applied to the control gate of the cell transistor. In response, an inversion layer forms in a channel region under the floating gate. This channel region (i.e., the inversion layer) has the same voltage (0V) as the source and drain. When a voltage difference between the floating gate and the channel voltage becomes high enough to cause the F-N tunneling, electrons tunnel to the floating gate from the channel region, thereby increasing the threshold voltage of the cell transistor. A programming operation raises the threshold voltage of a cell transistor high enough to prevent channel current through the cell transistor when a positive read voltage is applied to the control gate, the source is grounded, and a positive voltage is applied to drain. A cell transistor having the raised threshold voltage is referred to as a "programmed cell" or as being in a "programmed state," which represents data value "0".

EEPROMs can also achieve the high integration densities necessary for an inexpensive non-volatile memory. In particular, flash EEPROMs achieve high integration density that is adaptable to large capacity subsidiary storage elements, and more specifically, NAND-type flash EEPROMs provide higher integration densities than do the other well-known types of EEPROM (e.g., NOR or AND type EEPROM).

A convention NAND-type EEPROM includes a cell array containing NAND strings, where each NAND string includes a set of cell transistors connected in series. FIG. 1 shows a conventional NAND-type flash EEPROM 100 including a cell array 110 containing multiple NAND strings 112. In cell array 110, each NAND string 112 includes a first select transistor ST, M+1 (e.g., 16) cell transistors M0 to MM, and a second select transistor GT connected in series. Each first selection transistor ST has a drain connected to a corresponding bit line. Generally, all NAND strings in a column of cell array 110 share the same bit line. The second selection transistor GT in each NAND has a source connected to a common source line CSL for the sector containing the NAND string. Gates of the first and second selection transistors in a row of NAND strings 112 are respectively coupled to a string selection line SSL and a ground selection line GSL corresponding to the row. Each word line in cell array 110 connects to the control gates of all cell transistors in a corresponding row of cell array 110.

NAND-type flash memory 100 further includes a page buffer including latch circuits 130, sense circuits (not shown), and a Y or column decoder (Y pass gates 140). The sense circuits sense the states of selected bit lines to generate output data during a read operation. Latch circuits 130 control the voltages of selected bit lines for a write operation as described further below. An X or row decoder (not shown) activates a string selection line to select a row of NAND strings 112 and a word line that is coupled to the control gates of the cell transistors to be accessed. For reasons described further below, switching transistors 126 and 122e or 122o connect either the even numbered bit lines or the odd numbered bit lines to the sense circuits or latch circuits 130. Y pass gates 140 control and select data input/output of sense and latch circuits.

In array 110, a page includes a set of the cell transistors coupled to a word line associated with the page, and a block or sector is a group of pages. A block can include one or more NAND strings 112 per bit line. Typically, a read or write operation simultaneously reads or programs and entire page of memory cells, and an erase operation erases an entire block or sector.

To program a selected memory cell M1 in NAND flash memory 100, a bit line BL0 assigned to the memory string 112 including a selected memory cell M1 is biased to 0V. The string selection line SSL for the NAND string 112 containing the selected memory cell M1 is biased to the supply voltage Vcc to turn on the first selection transistor ST, and the ground selection line GSL is biased to 0V to turn off the second selection transistor GT. The word line WL1 connected to the control gate of the selected memory cell M1 is biased to a high voltage. Capacitive coupling between the control gate and the floating gate raises the floating gate to a voltage near the high voltage. In response to the voltage difference between the channel region and the floating gate in the selected memory cell M1, electrons from the channel region tunnel into the floating gate of the selected memory cell, thereby increasing the threshold voltage of the selected memory cell M1 to a positive level.

All control gates of memory cells included in the selected page are at the high voltage for a write operation. However, the page typically includes memory cells that will be programmed to store bit value "0" and other memory cells to be left in the erased state (i.e., are not programmed) and represent data value "1". To avoid programming a memory cell in the same page as memory cells being programmed, the channel voltage of the memory cell is boosted to reduce the voltage gap between the floating gate and the channel region. The lower voltage gap prevents significant F-N tunneling and keeps the memory cell in the erased state while other memory cells in the same page are programmed.

One useful technique for selectively increasing a channel voltage of a memory cell is often called "self-boosting". During self-boosting, the capacitive coupling between the floating gate and the channel region increases the channel voltage of a memory cell as the word line and floating gate voltages increase. Additionally, a corresponding bit line (i.e., a bit line not connected to a cell being programmed) and string selection line SSL are at a power supply voltage Vcc. Word lines other than the selected word line are at a voltage Vpass that is in a range between the control gate voltage required to turn on a memory cell and a voltage high enough to cause programming. With this biasing, the string selection transistor, which has a gate at supply voltage Vcc, turns off when the channel voltage of a cell transistor in the corresponding string reaches a voltage Vcc–Vth where Vth is the threshold voltage of the string selection transistor. The channel voltage can further rise from the Vcc–Vth to higher levels along the word line at the programming voltage.

Before programming, a "bit line setup" pre-charges to 0V the bit lines for the selected memory cells to be programmed and pre-charges to supply voltage Vcc the bit lines not connected to a memory cell to be programmed. After programming, all of bit lines are discharged to 0V during a "bit line discharge".

Recent NAND flash EEPROM chips use more dense design rules (e.g., closer line spacing) to achieve higher levels of integration. The increased density increases the coupling capacitance between adjacent conductive lines such as bit lines. The larger coupling capacitance between adjacent bit lines makes malfunctions more likely when adjacent bit lines are charged for writing different data values. In particular, a bit line at 0V can pull down the voltage of a neighboring bit line intended to be at supply voltage Vcc, and the write operation can disturb or program the threshold voltage of an cell transistor that was intended to remain erased.

One proposal for overcoming the problems associated with the bit line couplings is to have adjacent bit lines coupled to memory cells in different pages. Accordingly, in this architecture, which is said to employ "shielded bit lines", sense amplifiers and latch circuits 130 are only available for half of the bit lines and page selection transistors 122e and 122o select a page (even or odd bit lines) for a read or programming operation. Reading or programming is still performed in the unit of a page, but an unselected bit line acts as a shield between adjacent bit lines that are in the selected page. Accordingly, the influence between selected bit lines is greatly reduced.

However, program inhibition in the shielded bit line architecture charges bit lines assigned to a non-selected page (hereinafter referred to as "shielded bit lines") and bit lines connected to memory cell that are in a selected page but not to be programmed. A page buffer 135 can charge bit lines in the selected page to supply voltage Vcc or 0V according to corresponding data bits held in corresponding latch circuits 130. Charging the shielded bit lines up to supply voltage Vcc requires additional circuitry because page buffers 130 are required for the access of the selected page.

Memory 100 of FIG. 1 includes a conventional circuit that performs the bit line setup and discharging. As shown in FIG. 1, drains of MOSFETs 102e and 102o act as connecting circuits that connect respective even and odd bit lines to a virtual power node VIRPWR. Sources of the MOSFETs 150e and 150o connect in common to node VIRPWR, and an inverter 104 charges node VIRPWR to supply voltage Vcc during a bit line setup and to ground (0V) when all of the bit line discharge.

For bit line setup, inverter 104 charges node VIRPWR to supply voltage Vcc. Assuming that even-numbered bit lines are selected for programming, a signal VBLo is activated to turn on MOSFETs 102o and thereby charge the non-selected bit lines (i.e., odd-numbered bit lines) to supply voltage Vcc. (Gate selection signal VBLe remains deactivated during bit line setup if even-numbered bit lines are selected for programming.) After completing a programming operation, node VIRPWR goes to 0V, and signals VBLe and VBLo are both activated to turn on all MOSFETs 102o and 102e, thereby discharging all the bit lines to 0V.

As circuit density, data access rates, and required charging and discharging capacities increase, bit line setup and bit line discharge cause more noise in the power supply voltages Vcc or the ground voltage. In particular, the rapid switching when driving virtual power node VIRPWR to supply voltage Vcc or ground creates a large transient noise peak. Such noise concerns are likely to worsen as the memory circuit densities increase since the bit line setup raises half of the bit lines (the even-numbered or the odd-numbered) to supply voltage Vcc before programming. Further, discharging bit lines to ground (0V) in the worst case discharges all of bit lines after programming.

SUMMARY

In accordance with the invention, disclosed circuits and methods reduce the power and ground noise that occur when charging bit lines up to supply voltage Vcc or discharging the bit lines to ground (0V). In particular, one embodiment of the invention is a NAND EEPROM having a shielded bit line architecture. This NAND EEPROM has a virtual power node that is connected to bit lines for charging or discharging of the bit lines. A PMOS pull-up transistor and an NMOS pull down transistor connect to the virtual power node, and a control circuit for charging or discharging bit lines controls the gate voltages of the PMOS pull-up transistor and the NMOS pull-down transistor to limit peak current when charging or discharging bit lines. In particular, the control circuit operates the PMOS or NMOS transistor in a non-saturation mode to limit current. One such control circuit creates a current mirror or applies a reference voltage to control gate voltages.

One programming operation in accordance with the invention sets up bit lines by pre-charging unselected bit lines via the virtual power node and the PMOS pull-up transistor having controlled gate voltage. Latches in the programming circuitry of the EEPROM charge or discharge selected bit lines according to respective data bits being stored. At the end of the programming operation, all of the bit lines are discharged via the virtual power node and the NMOS pull-down transistor, which then has a controlled gate voltage.

Another bit line setup includes two stages. The first stage pre-charges all bit lines via the virtual power node and PMOS pull-up. The second stage uses the latches in a page buffer to discharge or leave charged the selected bit lines depending on respective data bits being stored. The gate voltages of NMOS transistors in the programming circuitry that connect the page buffer to the bit lines can be controlled to reduce noise caused by discharging selected bit lines through the latches.

Yet another embodiment of the invention is a non-volatile memory device such as a NAND flash EEPROM having a shielded bit line architecture. The non-volatile memory device includes an array of memory cells and a bit line bias circuit. The array of memory cells includes bit lines coupled to memory cells in respective columns of the array and word lines coupled to the memory cells in respective rows of the array. The bias circuit is coupled to the bit lines and includes a switch and a control circuit. The control circuit operates the switch to limit peak current drawn when simultaneously changing the voltage on a set of the bit lines.

In one embodiment, the switch includes a first PMOS transistor coupled between a supply voltage and a virtual power node and/or a first NMOS transistor coupled between a ground and the virtual power node. A connecting circuit selectably connects the virtual power node to even and odd bit lines. In another embodiment, the bias circuit includes NMOS transistors that are between the bit lines and respective latches in a page buffer for the memory device.

The control circuit controls the gate voltage of the PMOS and/or NMOS transistors. In particular, the control circuit can bias a PMOS transistor to conduct less than a saturation current to control current when charging bit lines, turn on the PMOS transistor to maintain the charged state of the bit lines, and turn off the PMOS transistor for discharging of the bit lines. Similarly, the control circuit can bias an NMOS transistor to conduct less than a saturation current to control current when discharging bit lines, turn on the NMOS transistor to maintain the discharged state of the bit lines, and turn off the NMOS transistor for charging of the bit lines. Accordingly, the non-volatile memory device can limit current and reduce noise when a virtual power node is used to charge or discharge bit lines or when a page buffer discharges bit lines.

In one embodiment, the control circuit includes: an output terminal connected to the gate of the first PMOS transistor; sources of a reference voltage, the supply voltage, and a ground voltage; and a switch circuit operable to connect any of the reference voltage, the supply voltage, and the ground voltage to the output terminal. The source of the reference voltage can include a second PMOS transistor and a second NMOS transistor connected in series between the supply voltage and the ground voltage. A gate and a drain of the second PMOS transistor are connected together and provide the reference voltage, and when the switch circuit operates to connect the reference voltage to the output terminal, current through the first PMOS transistor mirrors a current through the second PMOS transistor.

Another exemplary embodiment of the invention is a nonvolatile memory including a cell array, a virtual power node and a connecting circuit. The connecting circuit controls connections of the virtual power node to bit lines in the cell array for charging or discharging of the bit lines then connected to the virtual power node. A PMOS transistor, an NMOS transistor, and a control circuit control the current flowing through the virtual power node. The PMOS transistor is coupled between the virtual power node and a supply voltage, and the NMOS transistor is coupled between the virtual power node and a ground. The control circuit applies a first control signal to a gate of the PMOS transistor and a second control signal to a gate of the NMOS transistor.

One embodiment of this control circuit includes a first switch coupled between a source of a first reference voltage and a first node for output of the first control signal. When the first switch is activated, the first control signal is at the first reference voltage, and the first reference voltage applied to the gate of the PMOS transistor causes the PMOS transistor to conduct a non-saturation current.

The control circuit typically further includes a second switch coupled between a source of a second reference voltage and a second node for output of the second control signal. When the second switch is activated, the second control signal is at the second reference voltage, and the second reference voltage applied to the gate of the NMOS transistor causes the NMOS transistor to conduct a non-saturation current.

The control circuit may further include first and second pairs of series-connected transistors. The first pair of transistors is connected in series between the supply voltage and ground, with the first node being between the transistors in the first pair. The second pair of transistors is connected in series between the supply voltage and ground, with the second node being between the transistors in the second pair. Turning on one of the transistors in either pair can set the first and second control signals at ground or the supply voltage to maintain the virtual power node as required for charging or discharging of bit lines.

This embodiment of the non-volatile memory may further include: a page buffer; a plurality of NMOS transistors coupled between the page buffer to the bit lines of the cell array; and a control circuit. The control circuit operates the NMOS transistors to conduct a non-saturation current when the page buffer discharges one or more of the bit lines.

Another embodiment of the invention is a programming method for a non-volatile memory. The programming method includes pre-charging bit lines to a first voltage by operating a switch that is between the first voltage and the bit lines and thereby limiting peak current flowing through the switch to the plurality of bit lines. Applying a second voltage to a selected word line programs one or more selected memory cells coupled to the selected word line, but the first voltage remaining on one of the bit lines prevents programming of a memory cell coupled to that bit line and the selected word line. Typically, the switch comprises a transistor and operating the switch comprises controlling the transistor to conduct less than a saturation current, for example, by connecting the transistor into a current mirror circuit that limits the current through the transistor.

The pre-charging can charge all bit lines or just the unselected bit lines. When just the unselected bit lines are charged, latches in a page buffer for the memory charge or discharge selected bit lines according to corresponding data bits to be written. When pre-charging charges all bit lines, the page buffer only needs to discharge or maintain the charged state of selected bit lines according to the data bits being written. When the only currents through the latches are discharging bit lines to ground, the gate voltages of NMOS transistors connecting the latches to the bit lines can control the current and reduce noise caused by current through the latches.

Yet another embodiment of the invention is programming method that includes: pre-charging selected bit lines and unselected bit lines to a first voltage using current through a PMOS transistor that has a gate voltage controlled to limit current flow to the selected and unselected bit lines. The unselected bit lines are interleaved among the selected bit lines. After pre-charging, the programming method further includes discharging at least some of the selected bit lines to corresponding data latches through a plurality of NMOS transistors that are between the selected bit lines and the data latches. Gate voltages of the NMOS transistors are controlled to limit current through the NMOS transistors during the discharging. Applying a second voltage to a selected word line programs one or more selected memory cells coupled to the selected word line, but the first voltage remaining on one of the bit lines prevents programming of a memory cell coupled to that bit line and the selected word line.

BRIEF DESCRIPTION OF THE DRAWINGS

Use of the same reference symbols in different figures indicates similar or identical items.

DETAILED DESCRIPTION

In accordance with an aspect of the present invention, transistors biased to conduct less than a saturation current can reduce noise in supply and ground voltages by reducing the peak currents during charging or discharging of bit lines for a programming operation.

Figure 1:
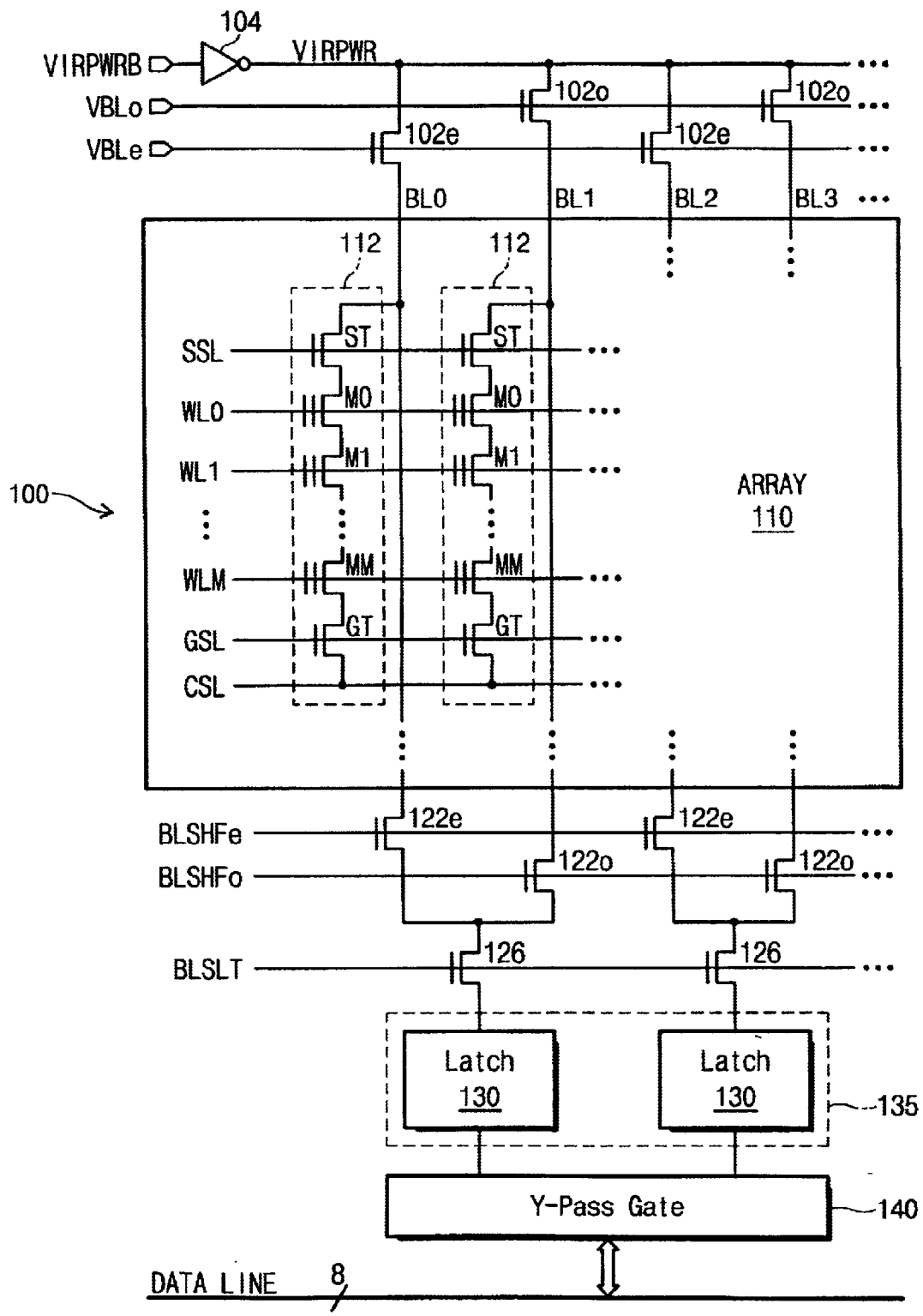
FIG. 1 shows a conventional NAND flash EEPROM.
Figure 2:
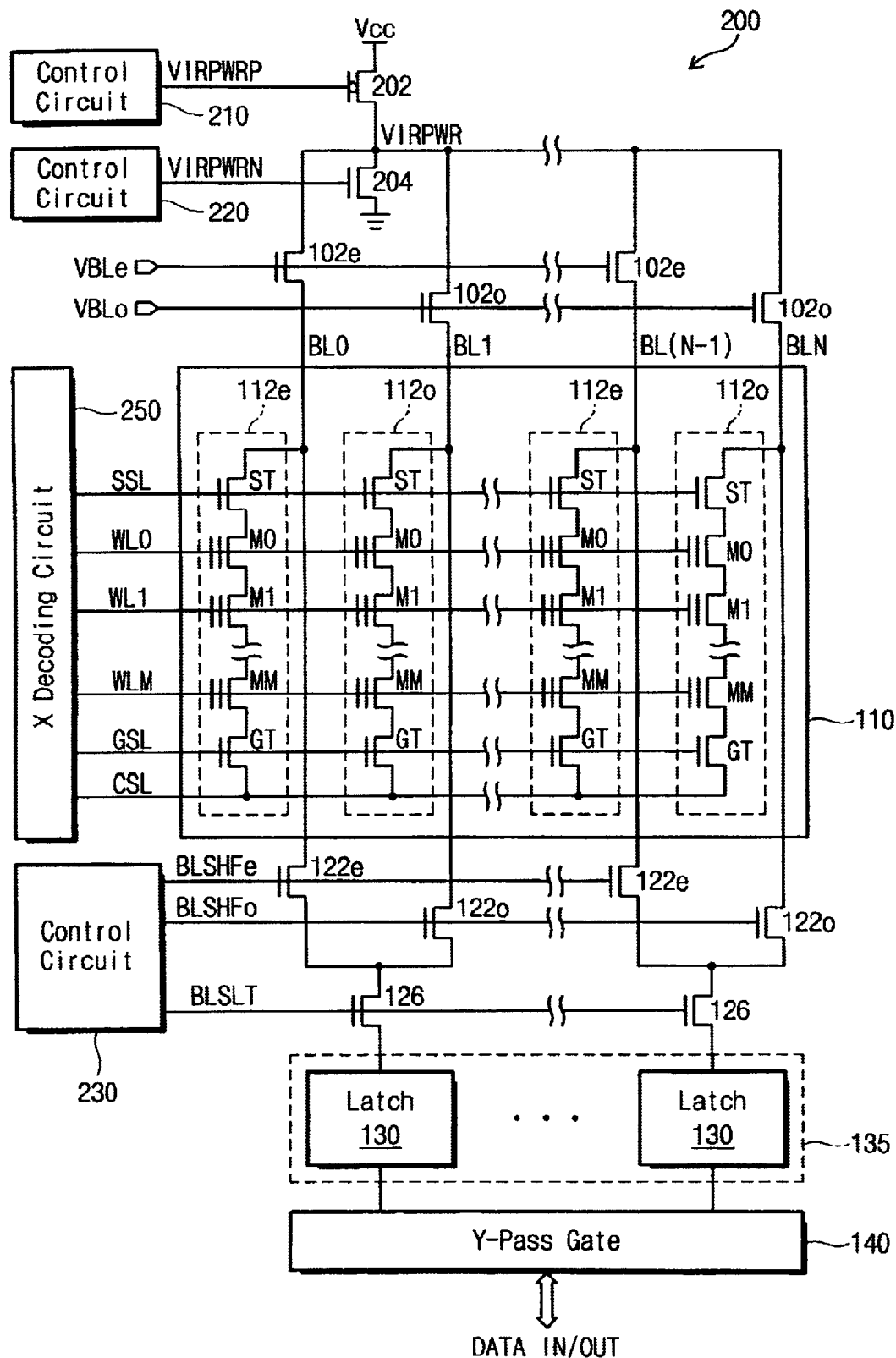
FIG. 2 shows a NAND flash EEPROM in accordance with an embodiment of the invention.

FIG. 2 shows a NAND flash EEPROM 200 according to an embodiment of the invention that reduces the peak current when charging or discharging bit lines. NAND flash EEPROM 200 includes a cell array 110, which can be a conventional NAND array such as described above in regard to FIG. 1. In particular, cell array 110 includes NAND strings 112 attached to bit lines BL0 to BLN. Although FIG. 2 shows only a single NAND string 112 coupled to each bit line, a typical embodiment would have multiple NAND strings coupled to each bit line.

Each NAND string 112 includes first and second select transistors ST and GT and M+1 cell transistors M0 to MM, which are connected in series. Each first select transistor has a drain coupled to a corresponding one of bit lines BL0 to BLN and a source coupled to cell transistor M0 in the associated NAND string 112. The first select transistors ST in each row of NAND strings 112 have gates coupled to a string select line SSL. Each second select transistor GT has a drain coupled to cell transistor MM in the associated NAND string 112 and a source connected to a common source line CSL. The second select transistors GT in each row of NAND strings 112 have gates coupled to a ground select line GSL.

Cell array 110 employs a shielded-bit line architecture. In particular, in each row of array 110, the cell transistors in NAND strings 112e connected to even-numbered bit lines BL0 to BL(N−1) form one page and cell transistors in NAND strings 112o coupled to odd-numbered bit lines BL1 to BLN form another page. Selection transistors 122e and 122o select either an even page or an odd page of cell transistors for an access. Each word line WL0 to WLM connects to cell transistors in every NAND string 112 in a row of NAND strings 112, and activation of a particular word line selects the row of array 110 associated with the activated word line.

In general, a word line in memory array having the shielded-bit line architecture may correspond to more than two pages, for example, four pages. In the case of four pages per row, an access operation connects one quarter of the bit lines (i.e., the bit lines associated with the selected page) to sense and latch circuits 130. Three quarters of the bit lines (i.e., the bit lines associated with unselected pages) provide shielding to reduce the effects of coupling capacitance between the bit lines. The shielding process for a memory having more than two pages per row is substantially the same as the shielding process for a memory having two pages per row. For ease of description, the example of two pages per row is more fully described herein.

While conventional NAND flash memories use inverters for charging or discharging a virtual power node and bit lines, NAND flash memory 200 employs a PMOS transistor 202 with a gate receiving a control signal VIRPWRP and an NMOS transistor 204 with a gate receiving a control signal VIRPWRN. PMOS transistor 202 charges a node VIRPWR up to supply voltage Vcc, and NMOS transistor 204 pulls node VIRPWR down to 0V. A control circuit 210 generates control signal VIRPWRP, and a control circuit 220 generates control signal VIRPWRN.

Figure 3A:
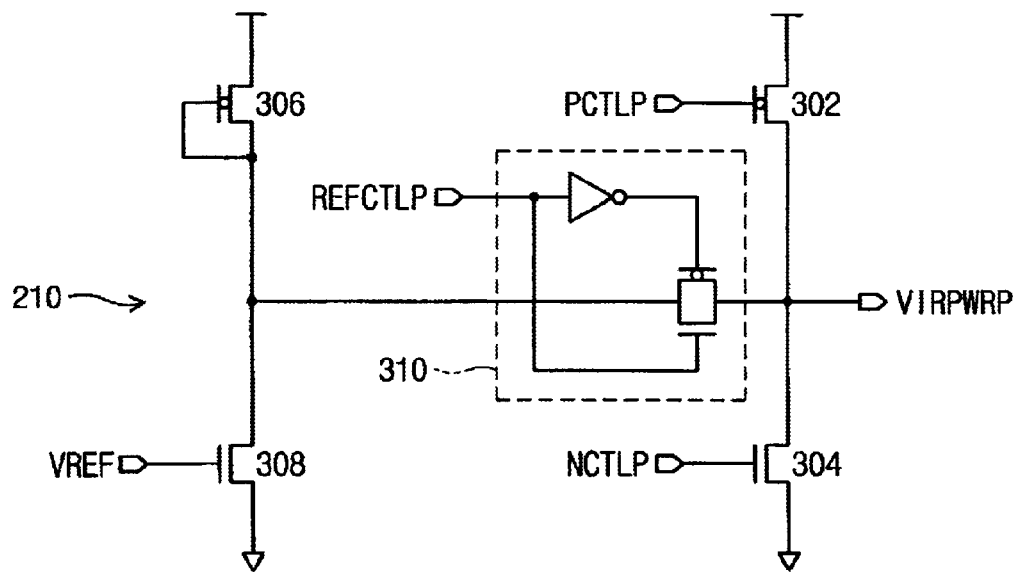
FIGS. 3A and 3B are circuit diagrams of control circuits suitable for use in the NAND flash EEPROM of FIG. 2.
Figure 3B:
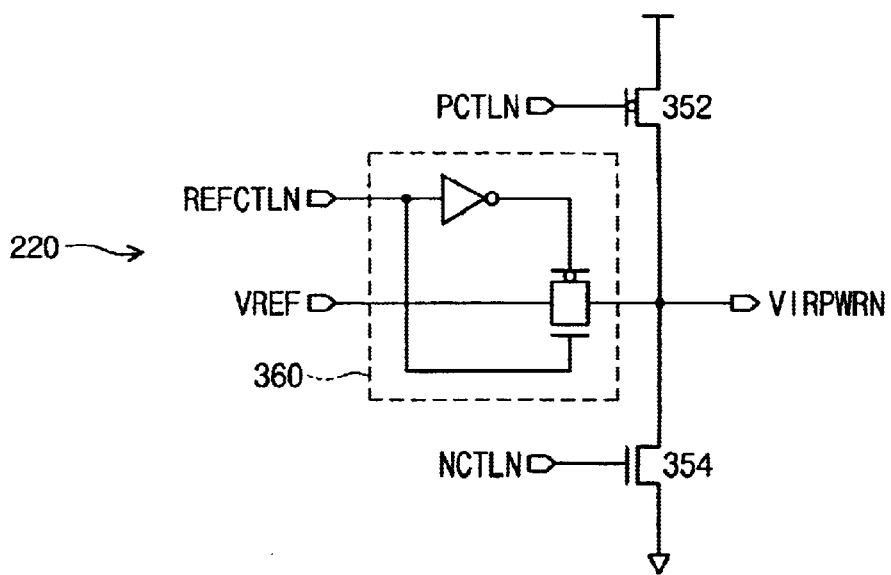

FIGS. 3A and 3B are schematic diagrams of embodiments of control circuits 210 and 220 that generate control signals VIRPWRP and VIRPWRN, respectively.

Referring to FIG. 3A, control circuit 210 includes two PMOS transistors 302 and 306, two NMOS transistors 304 and 308, and a switch 310. PMOS transistor 302 and NMOS transistor 304 are connected in series between supply voltage Vcc and ground, and control signal VIRPWRP is generated from a output node between transistors 302 and 304. PMOS transistor 306 and NMOS transistor 308 are also connected in series between supply voltage Vcc and ground, and the gate of transistor 306 is coupled to a node between transistors 306 and 308. Switch 310 controls whether the node between transistors 306 and 308 is electrically connected to the output node between transistors 302 and 304. In an exemplary embodiment, switch 310 includes a pass gate capable of conducting with minimal voltage drop at low or high voltage levels.

The input signals for control circuit 210 include three control signals PCTLP, REFCTLP, and NCTLP and a reference voltage VREF. Control signal PCTLP is applied to the gate of PMOS transistor 302. Control signal REFCTLP controls switch 310, and control signal NCTLP is applied to the gate of NMOS transistor 304. A circuit such as a state machine (not shown) can activate control signals PCTLP, REFCTLP, and NCTLP according to the timing required for programming of memory cells as described further below.

When control signal PCTLP is at a low level, PMOS transistor 302 pulls control signal VIRPWRP to high level, which turns off PMOS transistor 202 (FIG. 2). Alternatively, if control signal NCTLP is at supply voltage Vcc, NMOS transistor 304 turns on and pulls control signal VIRPWRP down to 0V, which turns on PMOS transistor 202.

To reduce a peak current before programming, during the bit line setup period when node VIRPWR goes to supply voltage Vcc from 0V, control signals NCTLP and PCTLP go to low and high levels, respectively, and turn off both transistors 302 and 304. Signal REFCTLP is activated (e.g., at supply voltage Vcc) to connect the node between transistors 306 and 308 to the gate of PMOS transistor 202 (FIG. 2). This configuration creates a current mirror for which the current through PMOS transistor 202 mirrors the current through PMOS transistor 306. Reference voltage VREF, which is applied to the gate of NMOS transistor, controls the current through series connected transistors 308 and 306, and accordingly controls the current through PMOS transistor 202. The non-saturation current through PMOS transistor 202 causes a controlled rise in the voltage of node VIRPWR that causes the voltage of connected even or odd numbered bit lines to correspondingly increase. Thus, the current drawn during the bit line setup is controlled to avoid sudden peaks, thereby reducing the power noise.

When the bit lines reach a sufficiently high voltage, control signal REFCTLP is deactivated, and control signal NCTLP is activated to supply voltage Vcc, turning on transistor 304. Thus, control signal VIRPWRP falls to ground voltage (0V), turning on PMOS transistor 202 to maintain bit lines at the supply voltage Vcc.

Referring to FIG. 3B, control circuit 220 includes a PMOS transistor 352, an NMOS transistor 354, and a switch 360. PMOS transistor 352 and NMOS transistor 354 are connected in series between supply voltage Vcc and ground, and control signal VIRPWRN is generated from a output node between transistors 352 and 354. In an exemplary embodiment, switch 360 controls whether reference voltage VREF is applied to the output node between transistors 352 and 354.

NMOS transistor 204, which is connected between node VIRPWR and the ground, turns on in response to control signal VIRPWRN going to supply voltage Vcc. In particular, when control signal PCTLN is at 0V, transistor 352 turns on to pull control signal up to supply voltage Vcc. This turns on NMOS transistor 204, which pulls node VIRPWR down to 0V. Alternatively, when control signal NCTLN is at supply voltage Vcc, NMOS transistor 354 turns on and pulls control signal VIRPWRN to 0V, which turns off NMOS transistor 204 to maintain node VIRPWR at supply voltage Vcc.

To reduce peak currents and system noise during the discharge period, both transistors 352 and 354 are turned off, and control signal REFCLTN is activated so that switch 360 applies reference voltage VREF to the output node between transistors 352 and 354. Accordingly, control signal VIRPWRN and the gate of NMOS transistor 204 are at reference voltage VREF, which limits the current through NMOS transistor 204. The limited current reduces ground noise that large peak current could otherwise cause when simultaneously discharging bit lines.

Figure 4:
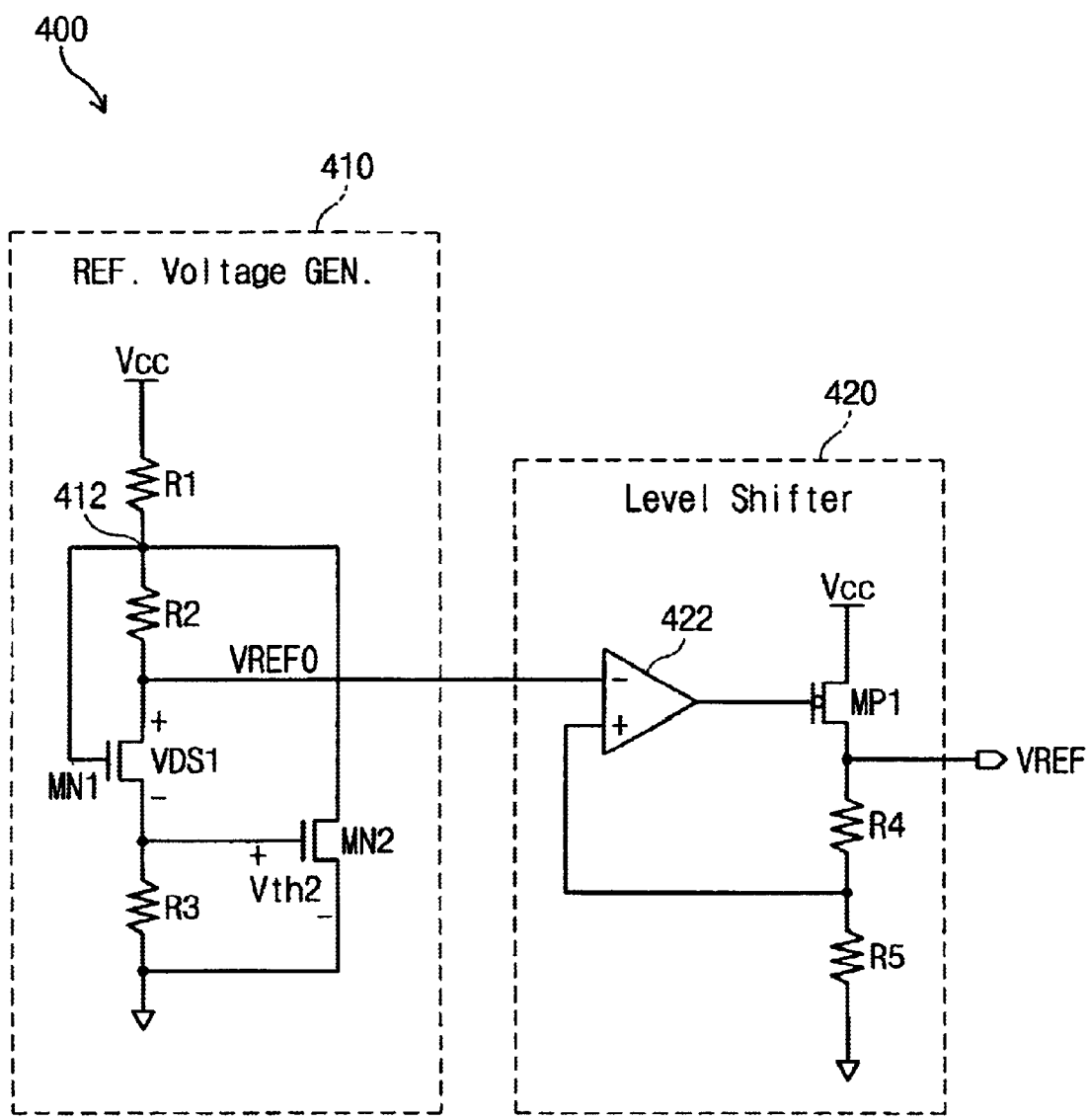
FIG. 4 is a circuit diagram of a reference voltage generator.

In the exemplary embodiment of the invention illustrated in FIGS. 3A and 3B, reference voltage VREF, which can be carefully controlled using a reference voltage generator, controls the current during the bit line setup period and during the bit line discharge period. FIG. 4 is shows an exemplary circuit 400 that includes a reference voltage 410 that generates a reference voltage VREF0 and a level shifter 420 that converts reference voltage VREF0 to the reference voltage VREF having the desired level.

In reference voltage generator 410, a resistor R1, a resistor R2, an NMOS transistor MN1, and a resistor R3 are connected in series between supply voltage Vcc and ground. The gate of transistor MN1 is connected to a node 412 between resistors R1 and R2. Another NMOS transistor MN2 is connected between node 412 and ground. With this configuration, the reference voltage VREF0 from the drain of NMOS transistor MN1 remains constant when supply voltage Vcc or the temperature vary.

Level shifter 420 includes a PMOS transistor MP1, a resistor R4, and a resistor R5 that are connected in series between supply voltage Vcc and ground. A differential amplifier 422, which controls the gate voltage of transistor MP1, has a negative input and a positive input connected to respectively receive reference voltage VREF0 and a voltage from a node between transistors R4 and R5. Reference voltage VREF thus generated from the drain of PMOS transistor MP1 has a level that depends on VREF0 and the ratio of the resistances of resistors R4 and R5.

Figure 5:
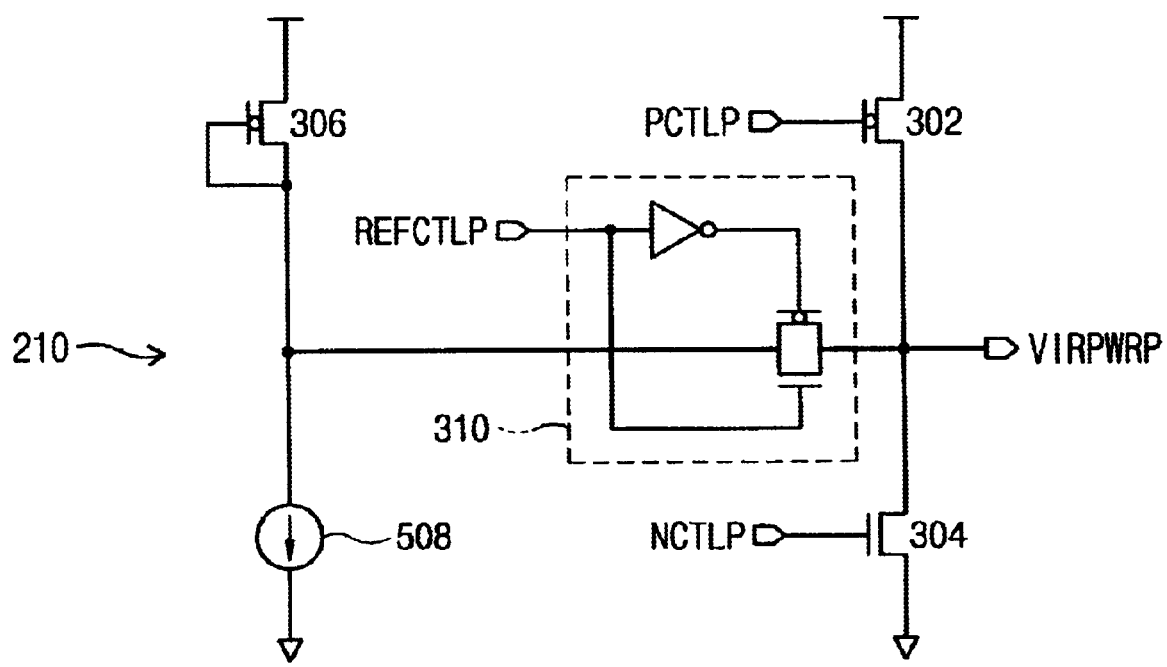
FIG. 5 is a circuit diagram of a variation of the control circuit of FIG. 3A.

A reference voltage generated by circuit 400 or by any other suitable reference voltage generator circuit can directly control the gate voltages of NMOS or PMOS transistors to limit discharging or charging currents and avoid peak currents that cause noise. A current mirror circuit as described above can use the same reference voltage to generate suitable control voltages for PMOS or NMOS transistors of the complementary conductivity type. Alternatively, embodiments can us independent mechanisms for current control through transistors of different conductivity types. For example, FIG. 5 shows an alternative embodiment of control circuit 210. In FIG. 5, a current source 508 controls the current through transistor 306 and through the current mirror created during the bit line setup period. A similar and independent current mirror circuit can limit the current flow during the bit line discharge period.

Figure 6:
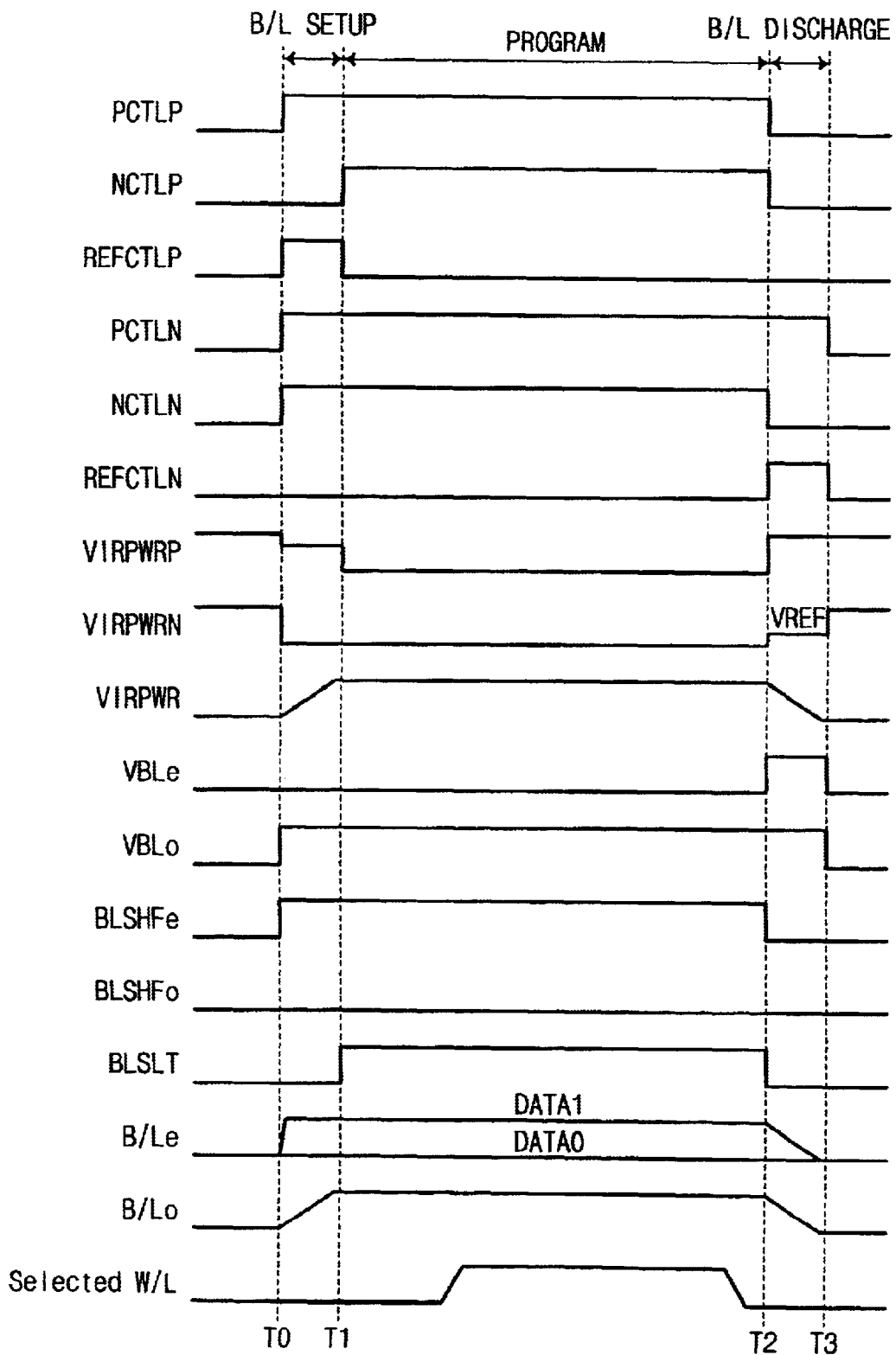
FIG. 6 is a timing diagram of a programming operation in the NAND flash EEPROM of FIG. 2.

FIG. 6 is a timing diagram illustrating signal levels during an exemplary programming operation. The exemplary programming operation programs cell transistors in selected even-numbered NAND strings 112e and pre-charges odd numbered bit lines B/Lo to supply voltage Vcc. The programming operation of FIG. 6 is described herein in the context of NAND flash memory 200 of FIG. 2 including control circuits 210 and 220 as respectively illustrated in FIGS. 3A and 3B.

In FIG. 6, a bit line setup period begins at a time T0 and extends to a time T1. For charging of the odd numbered bit lines B/Lo, control signals PCTLP, REFCTLP, PCTLN, NCTLN, and VBLo are activated (i.e., at supply voltage Vcc). Control signals NCTLP, REFCTLN, and VBLe remain deactivated (i.e., at 0V). As a result, control signals PCTLN, NCTLN, and REFCTLN cause transistor 354 in control circuit 220 to pull signal VIRPWRN to 0V, which shuts off NMOS transistor 204. Control signals PCTLP and NCTLP turn off transistors 302 and 304, and control signal REFCTLP connects PMOS transistor 202 in a current mirror circuit including transistors 306 and 308. The current through PMOS transistor 202, which charges node VIRPWR, is thus limited according to the current through transistors 306 and 308. Signal VBLo turns on transistors 102o, which electrically connect node VIRPWR to the odd numbered bit lines B/Lo. Accordingly, the odd numbered bit lines B/Lo charge up to supply voltages Vcc at a controlled rate as does node VIRPWR. This reduces the supply voltage noise created by charging the odd bit lines B/Lo at an uncontrolled rate.

In the program operation of FIG. 6, node VIRPWR does not charge the even numbered bit lines B/Le because signal VBLe turns off transistors 102e to disconnect node VIRPWR from the even numbered bit lines B/Le. During the setup period, page buffer 135 including latch circuits 130 charges even numbered bit lines B/Le to levels that depend on the bit values being stored in respective cell transistors. In particular, latch circuits 130 latch respective input data bits from Y pass gates 140, and each latch circuit 130 generates an output signal at a high or low level (supply voltage Vcc or 0V) if the corresponding input data bit is "1" or "1". For the bit line setup period, signals BLST and BLSHFe are activate to turn on transistors 122e and 126 and connect latch circuits 130 to respective even bit lines. A signal BLSHFo remains at a low level to disconnect the odd numbered bit lines from sense and latch circuits 130.

After the bit line setup period, a programming operation extends from a time T1 to a time T2. At time T1, control signal REFCTLP becomes deactivated, and control signal NCTLP becomes activated. As a result, transistor 304 in control circuit 210 pulls signal VIRPWRP from an intermediate voltage level to 0V, and signal VIRPWRP turns on PMOS transistor 202. The programming then proceeds in the conventional manner well known for NAND flash memory. In particular, a row decoding circuit charges select lines SSL and CSL to the supply voltage Vcc and charges the selected word line to a programming voltage, typically about 10V. During the programming, the combination of the high programming voltage on a word line coupled to a cell transistor and a low voltage on the bit line coupled to the NAND string containing the cell transistor changes the cell transistor from the erased state (representing bit value "1") to the programmed state (representing bit value "0").

After the programming period, a bit line discharge period extends from time T2 to a time T3. For discharging of the even and odd bit lines B/Le and B/Lo, control signals PCTLN REFCTLN, VBLe, and VBLo are activated (i.e., at supply voltage Vcc). Control signals PCTLP, NCTLP, REFCTLP, and NCTLN become or remain deactivated (i.e., at 0V). As a result, control signals PCTLP, NCTLP, and REFCTLP cause transistor 302 in control circuit 210 to pull signal VIRPWRP to supply voltage Vcc, which shuts off PMOS transistor 202. Control signals PCTLN and NCTLN turn off transistors 352 and 354, and control signal REFCTLN sets control signal VIRPWRN at reference voltage VREF, which limits the current through NMOS transistor 204. Signals VBLe and VBLo turn on transistors 102e and 102o, which electrically connect node VIRPWR to the even and odd numbered bit lines B/Le and B/Lo. Accordingly, the bit lines discharge to 0V at a controlled rate as does node VIRPWR. This reduces the ground noise otherwise created by simultaneous, uncontrolled discharge of all of the lines B/Lo.

As described above, the bit line setup process reduces noise generated from charging of unselected (e.g., odd) bit lines. However, latch circuits 130 in page buffer 135 charge the selected (e.g., even) bit lines. In the worst case, all data bits are "high", and page buffer 135 quickly charges about half of the bit lines to supply voltage Vcc. This creates a large peak current and supply voltage noise that is difficult to reduce. In particular, NMOS transistors 126 and 122, which connect the bit lines to the latch circuits 130 of page buffer 135, are not well suited for current restriction when charging selected bit lines to supply voltage Vcc. Further, adding circuit elements (e.g., PMOS transistors) to control the current flowing between each latch circuit 130 and the respective bit lines would be difficult because the space between the bit lines is narrow in a highly integrated semiconductor memory. (In contrast, PMOS transistors 202 are not required to be at the same pitch as the bit lines because a common node VIRPWR serves all bit lines.)

Figure 7:
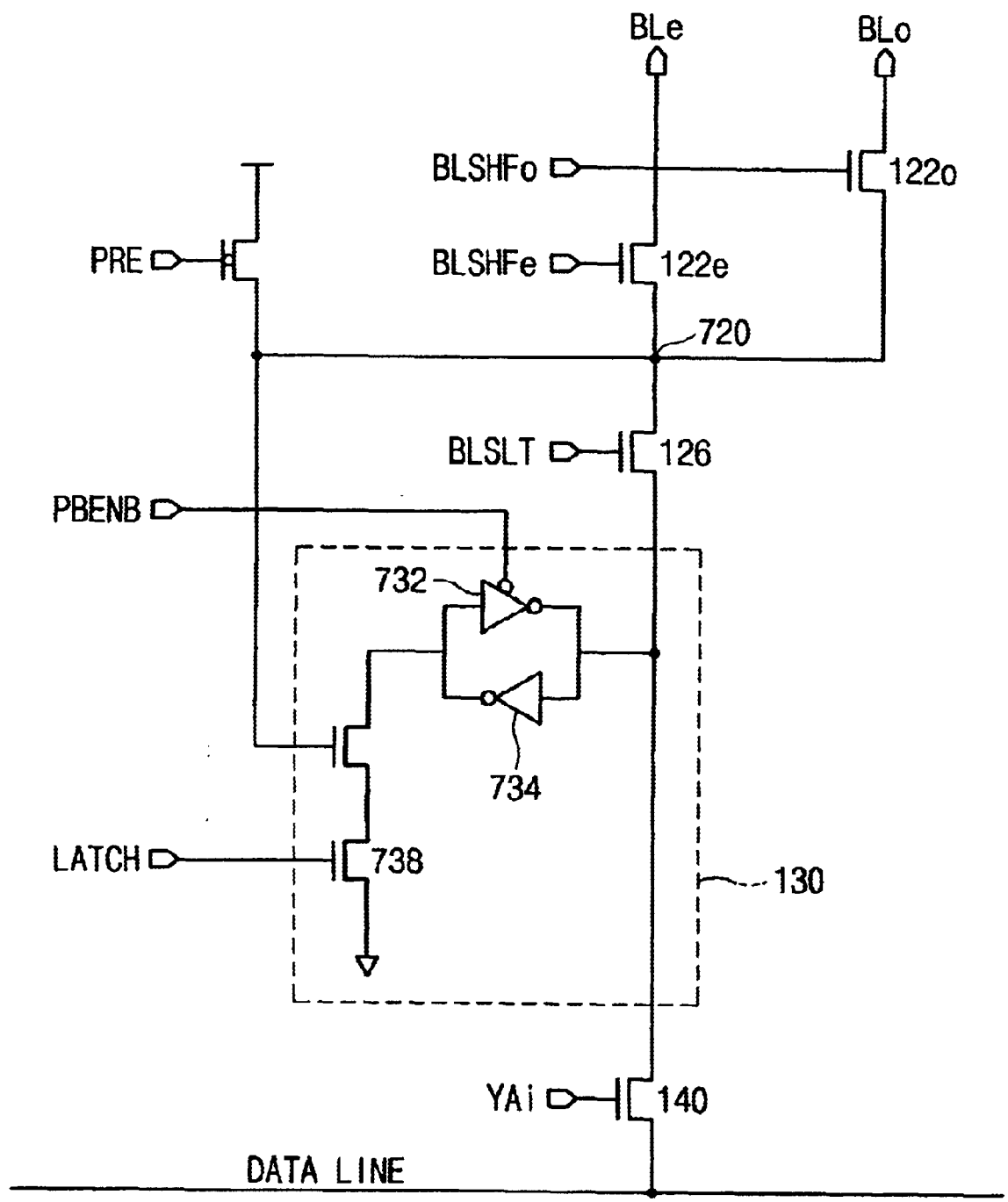
FIG. 7 is a circuit diagram of a sensing and latch circuit in accordance with an embodiment of the invention.

In accordance with another aspect of the invention, currents spikes resulting from latch 130 simultaneously charging or discharging bit lines of the selected page are avoided using a two-part bit line setup operation and discharging through sensing and latch circuit 130. FIG. 7 is a circuit diagram of sense and latch circuitry for a single data bit. As noted above, page selection transistors 122e and 122o connect either an even bit line or an odd bit line to a sensing node 720 for an access. For a write operation, latch 130 discharges the connected bit line only if latch 130 holds a data value "0" when signal BLSLT turns on transistor 125.

Figure 8:
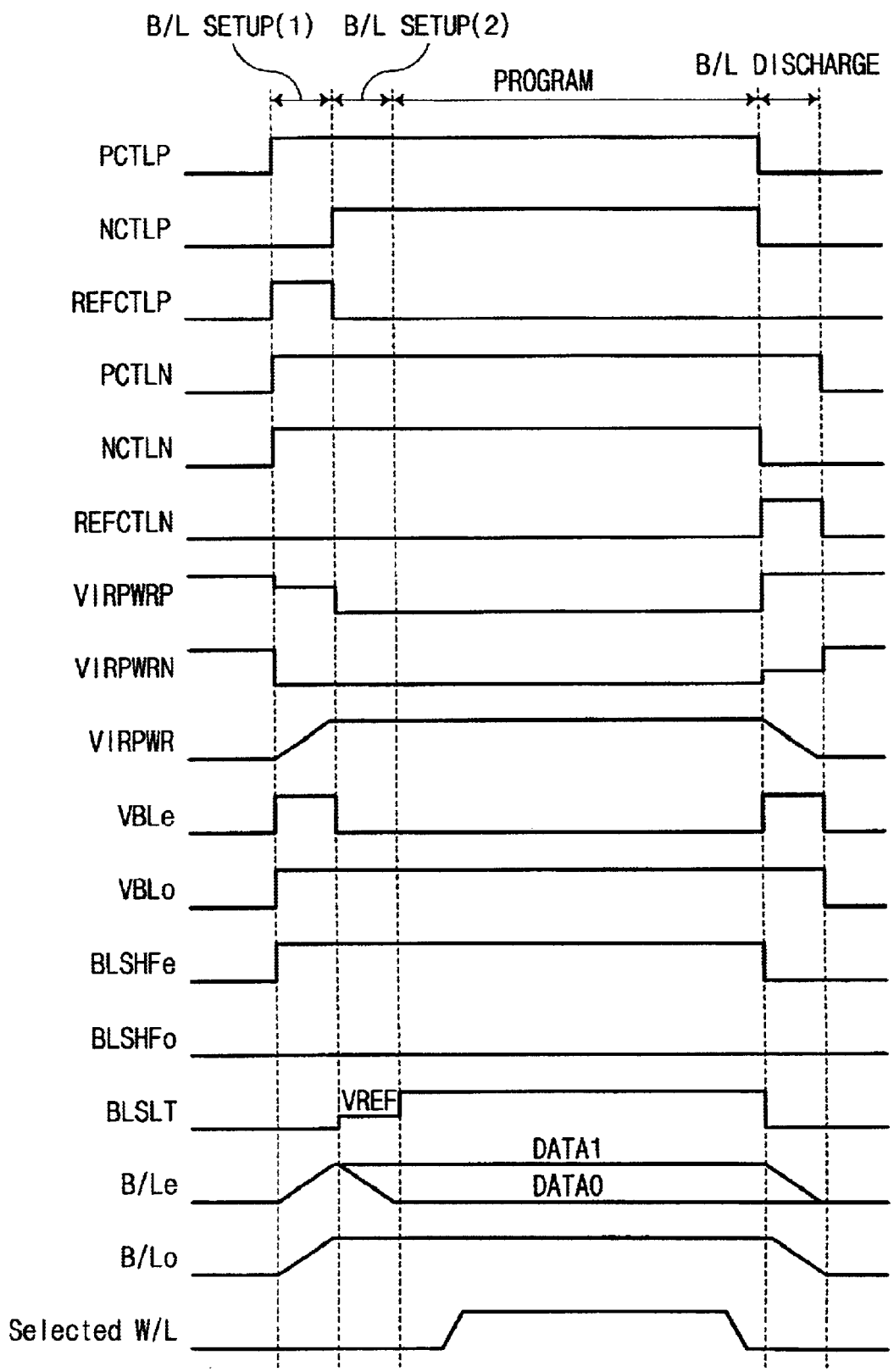
FIG. 8 is a timing diagram of an alternative programming operation in the NAND flash EEPROM of FIG. 2.

FIG. 8 is a timing diagram of a programming operation that reduces supply voltage noise that results from latch circuits 130 charging and discharging of selected bit lines. The programming operation of FIG. 8 uses a bit line setup that includes two parts. During a first part, all of the bit lines (even and odd) are charged at a controlled rate. During the second part, latch circuits 130 discharge selected bit lines preferably at a controlled rate.

As shown in FIG. 8, both control signals VBLe and VBLo are activated to the supply voltage Vcc during the first part SETUP(1) of the bit line setup. Accordingly, node VIRPWR is electrically connected to all of the bit lines. Additionally, control signals PCTLP, REFCTLP, PCTLN, and NCTLN are activated, and control signals NCTLP and REFCTLN are deactivated. As described above these states for control signals PCTLN, NCTLN, and REFCTLN cause transistor 354 in control circuit 220 to pull signal VIRPWRN to 0V, which shuts off NMOS transistor 204. Control signals PCTLP and NCTLP turn off transistors 302 and 304, and control signal REFCTLP connects PMOS transistor 202 in a current mirror circuit including transistors 306 and 308. The current through PMOS transistor 202, which charges node VIRPWR, is thus limited according to the current through transistors 306 and 308. Signals VBLe and VBLo turn on transistors 102e and 102o, which electrically connect node VIRPWR to all bit lines. Accordingly, the bit lines all charge up to supply voltages Vcc at a controlled rate as does node VIRPWR.

During or before the first part of the bit line set up, latches 130 can latch data bits from associated data lines. In the circuitry of FIG. 7 for example, a precharge signal PRE can be activated (low) to precharge node 720 and latch 130. An enable signal PBENB then disables an inverter 732 in latch 130, and Y pass gate 140 is activated to conduct a data signal from a data line to an input terminal of an inverter 734. A latch signal LATCH turns off a transistor 738 so that the data signal controls the output signal of inverter 734, which is the input signal of inverter 732. When the output signal of inverter 734 settles, signal PBENB activates inverter 732. During this time, signal BLSLT keeps transistor 126 off, and Y pass gate 140 is shut off before signal BLSLT turns transistor on during the second part SETUP(2) of the bit line setup.

At the end of the first part SETUP(1) of the bit line setup, signal REFCTLP is deactivated to disconnect PMOS transistor 202 from the current mirror, and signal NCTLP is activated to drive signal VIRPWRP to 0V and fully turn on PMOS transistor 202.

Control signal BLSLT is at a low level (0V) during the first part of the setup to shut off NMOS transistors 126 and disconnect latch circuits 130 from the bit lines. During the second part SETUP(2) of the bit line setup, the reference voltage VREF is applied to the gate of NMOS transistors 126. Signal BLSHFe is activated to turn on transistors 122e and connect latch circuits 130 to respective even bit lines B/Le. (In an alternative programming operation that programmed cell transistors coupled to odd numbered bit lines B/Lo, signal BLSHFo would be activated instead of signal BLSHFe.) Similarly, control signal VBLe is deactivated during the second part SETUP(2) of the bit line setup to shut off transistors 102e and disconnect the even bit lines B/Le from node VIRPWR.

All of the bit lines are charged when the second part SETUP(2) of the bit line setup starts. Latch circuits 130 discharge the bit lines corresponding to cell transistors being programmed to store the bit value "0" and maintain the charging of bit lines corresponding to cell transistors storing the bit value "1". Unlike the case of charging bit lines to supply voltage Vcc, NMOS transistors 126 are well suited for controlling the current when discharging the selected bit lines. A control circuit 230, which is similar or identical to control circuit 220, can set the reference voltage VREF so that transistors 126 conduct non-saturation currents. (Signals BLSHFe and BLSHFo can similarly control the gate voltages of transistors 122e and 122o.) With transistors 126 limiting the current, latch circuits 130 do not cause a spike in the current. Accordingly, the program operation of FIG. 8 reduces the noise that latch circuits 130 might otherwise create in the supply voltage Vcc or ground.

Following the second part of the bit line setup, the programming operation of FIG. 8 proceeds to program selected cell transistors and discharge all of the bit lines in the same manner described above in regard to FIG. 6.

Although the invention has been described with reference to particular embodiments, the description is only an example of the invention's application and should not be taken as a limitation. Various adaptations and combinations of features of the embodiments disclosed are within the scope of the invention as defined by the following claims.

I claim:

1. A programming method for a non-volatile memory, comprising:

pre-charging selected bit lines and unselected bit lines in an array to a first voltage using current through a PMOS transistor having a gate voltage controlled to limit current flow to the selected and unselected bit lines, wherein the unselected bit lines are interleaved among the selected bit lines;

discharging some of the selected bit lines to corresponding data latches through a plurality of NMOS transistors that are between the selected bit lines and the data latches, wherein a gate voltage of the NMOS transistors are controlled to limit current through the NMOS transistors during the discharging; and applying a second voltage to a selected word line to program one or more selected memory cells coupled to the selected word line, wherein the first voltage remaining on one of the bit lines prevents programming of a memory cell coupled to that bit line and the selected word line.

2. The method of claim 1, wherein the discharging is through transistors bias to conduct less than a saturation current for the transistor.

* * * * *